(12) United States Patent
Ueno et al.

(10) Patent No.: US 6,288,612 B1
(45) Date of Patent: Sep. 11, 2001

(54) RADIO COMMUNICATION APPARATUS AND RADIO FREQUENCY POWER AMPLIFIER

(75) Inventors: Hirotaka Ueno, Mochizuki-machi; Yasuhiro Nunogawa, Takasaki; Tetsuaki Adachi, Toubu-machi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/722,563

(22) Filed: Nov. 28, 2000

Related U.S. Application Data

(63) Continuation of application No. 09/385,690, filed on Aug. 30, 1999, now Pat. No. 6,172,567.

(30) Foreign Application Priority Data

Aug. 31, 1998 (JP) .................................................. 10-244709

(51) Int. Cl.[7] .................................................... H03G 3/30
(52) U.S. Cl. ........................... 330/285; 330/281; 330/133
(58) Field of Search ..................................... 330/133, 134, 330/141, 281, 285

(56) References Cited

U.S. PATENT DOCUMENTS

| | | | |
|---|---|---|---|
| 5,373,251 | * 12/1994 | Kunimoto et al. | 330/285 X |
| 5,376,895 | * 12/1994 | Aihara | 330/133 X |
| 5,697,074 | * 12/1997 | Makikallio et al. | 330/281 X |
| 5,914,641 | * 6/1999 | Yun et al. | 330/285 X |
| 6,172,567 | * 1/2001 | Ueno et al. | 330/285 |
| 6,188,283 | * 2/2001 | Hagio et al. | 330/285 |

FOREIGN PATENT DOCUMENTS

| | | | |
|---|---|---|---|
| 5-152978 | 6/1993 | (JP) | 330/127 |
| 6-310954 | 11/1994 | (JP) . | |
| 7-143506 | 6/1995 | (JP) . | |

OTHER PUBLICATIONS

Nikkei Electronics, Jan. 27, 1997, pp. 115–126 and English translation.

* cited by examiner

*Primary Examiner*—Steven J. Mottola
(74) *Attorney, Agent, or Firm*—Mattingly, Stanger & Malur

(57) ABSTRACT

To reduce power consumption by increasing amplifying efficiency in a low power mode, there is provided a radio communication apparatus in which each of field effect transistors of a radio frequency power module in a multistage configuration is controlled by an APC circuit based on a power level instruction signal, and in which a correction circuit is incorporated between the gate of a final stage transistor and the APC circuit to apply a linear gate voltage to the final stage transistor when a High level signal based on the power level instruction signal is applied and to provide a maximum gate voltage of the final stage transistor which is equal to or lower than the gate voltages of other transistors and whose rate of increase relative to the output voltage of the APC circuit gradually reduces when a Low level signal based on the power instruction signal is applied. A high power mode is enabled when the output voltage of the APC circuit is equal to or higher than a prescribed voltage, and a low power mode is enabled when it is lower than the prescribed voltage.

11 Claims, 13 Drawing Sheets

Ids-Vgs CHARACTERISTICS $$V_{apc}(sw) = \frac{R3+R4}{R4} \times V_{TH}$$

RADIO COMMUNICATION APPARATUS AND RADIO FREQUENCY POWER AMPLIFIER

This is a continuation application of U.S Ser. No. 09/385,690, filed Aug. 30, 1999 now U.S Pat. No. 6,172,567.

BACKGROUND OF THE INVENTION

1. Field of the Invention

The present invention relates to radio communication apparatuses and amplifiers (radio frequency power modules) incorporated in radio communication apparatuses and, more particularly, to a technique which is advantageously applied to techniques capable of improving amplification efficiency in a low power mode.

2. Description of the Prior Art

An amplifier (RF power module) including a multiplicity of stages of MOSFETs, GaAs MESFETs or the like is incorporated in an output stage at the transmission end of a transmitter of a radio communication apparatus (mobile communication apparatus) such as a mobile phone or portable telephone.

In general, a portable telephone has a system configuration which enables communication with its output varied in adaptation to the environment in accordance with a power level instruction signal from a base station so as not to cause interruption with other portable telephones.

Radio frequency power amplifiers (RF power amplifier circuits) are discussed on pages 115–126 of "Nikkei Electronics" Jan. 27, 1997, issued by Nikkei BP. This article discusses standard systems of 900 MHz band cellular type portable telephones in the United States and the GSM system in Europe. This article also discusses output control systems and it states "a widely used output control method is to vary the magnitude of an input signal to the final stage of a transmitter using a programmable attenuator with the gain of the final stage kept constant.

The same article also says "users regard the capability of a portable telephone to communicate a remote base station as important as the life of the battery regardless of the system of the same. All standards for cellular type portable telephones define an output range, and designers had better design telephones which can provide an output close to the allowable maximum output.

A radio frequency power amplifier (radio frequency power amplifier circuit) at the output stage of the transmission end of a cellular type portable telephone has a configuration in which the output is controlled by an APC (automatic power control) circuit and in which a gate voltage is controlled to provide an output as required for a call.

Since the power amplifier circuit has the best power source efficiency at the maximum output thereof, an abrupt reduction in the power supply efficiency occurs when the power amplifier circuit has a low output level. Therefore, the power supply efficiency is low when the telephone is used at a low output level, e.g., when it is used in the vicinity of a base station, which causes consumption of the battery at a high rate to shorten the life of the battery. This reduces call time per battery.

Conventional radio frequency power amplifiers suffer from deterioration of linearity and AM/AM characteristics (AM/AM conversion) at a low output (e.g., +5 dBm) because the gate bias of a power MOS at the final stage thereof is simply decreased.

SUMMARY OF THE INVENTION

It is an object of the invention to provide a radio frequency power amplifier and a radio communication apparatus which operate with high amplifying efficiency regardless of the output level.

It is another object of the invention to provide a radio frequency power amplifier and a radio communication apparatus which operate with high amplifying efficiency regardless of the output level and which has preferable linearity and AM/AM characteristics at a low output.

It is still another object of the invention to provide a radio frequency power amplifier and a radio communication apparatus which can provide a long call time and a long battery life.

The above and other objects and features of the present invention will be understood from the description of this specification and the accompanying drawing.

Typical aspects of the invention disclosed in this specification will now be briefly described.

While a field effect transistor (FET) will be disclosed below as an example of a semiconductor amplifying element, semiconductor amplifying elements are not limited to field effect transistors, and bipolar transistors, heterojunction bipolar transistors (HBT), high-electron-mobility transistors (HEMT) and the like are also included. Further, semiconductor substrates for forming semiconductor amplifying elements thereon are not limited to silicon substrates, and silicon-germanium substrates, gallium-arsenic substrates and the like are also included.

(1) There is provided a semiconductor amplifier circuit formed by assembling a plurality of field effect transistors into a multiplicity of stages, which includes a correction circuit for controlling a bias voltage applied to the gate electrode of the field effect transistor at the final stage. A bias voltage applied to the field effect transistor at each stage is supplied through a power control terminal. When an automatic power control (APC) circuit instructs a high power mode, the correction circuit increases the bias voltage applied to the gate electrode of the field effect transistor of the final stage at a constant increase rate in accordance with an increase in the bias voltage supplied from the power control terminal. When the automatic power control circuit instructs a low power mode, the correction circuit increases the bias voltage applied to the gate electrode of the field effect transistor of the final stage at an increase rate which gradually decreases with the increase of the bias voltage supplied from the power control terminal.

In this case, the semiconductor amplifier circuit has a configuration incorporating a plurality of field effect transistors in the form of a multiplicity of stages and including a correction circuit as described above, an input terminal, an output terminal, a plurality of reference potential terminals, control terminals connected to the gate terminals of the plurality of field effect transistors and a bias switch terminal.

The correction terminal is connected to a node A in a path for applying a bias power supply between the gate electrode of the field effect transistor of the final stage and the automatic power control circuit. The correction circuit is comprised of a correction field effect transistor, a switching field effect transistor and a plurality of resistive elements. The correction field effect transistor is connected to the node A at the drain terminal thereof, to the node A through a resistor at the gate terminal thereof and to a reference potential (Gnd) at the source terminal thereof. The correction field effect transistor and the field effect transistor of the final stage are identical in their structure and are formed on the same semiconductor substrate, and the size of the correction field effect transistor is a reduction of the size of the final stage field effect transistor at a predetermined ratio. The switching field effect transistor is connected to the gate terminal of the correction field effect transistor at the drain terminal thereof, to a bias switch terminal at the gate terminal thereof and to the reference potential (Gnd) at the source terminal thereof.

A signal output by an output power level control circuit is connected to the bias switch terminal.

(2) In the configuration described in the above (1), the output of the automatic power control circuit may be connected to the bias switch terminal to establish a low power mode when the output signal of the automatic power control circuit is lower than a prescribed voltage and a high power mode when it is higher than the prescribed voltage.

In such a configuration, the output of the automatic power control circuit is connected to the bias switch terminal which is connected to the gate terminal of the switching field effect transistor as described in the above (1).

(3) In still another configuration, the correction circuit is not provided; a low power mode and a high power mode are respectively established when the output signal of the automatic power control circuit is lower and higher than a prescribed voltage; and, in the high power mode, bias voltages supplied to the gate terminals of all field effect transistors are supplied as the output signal of the automatic power control circuit. In the low power mode, a predetermined voltage is applied as the bias voltage supplied to the gate terminal of the field effect transistor at the final stage, and the output signal of the automatic power control circuit is supplied as bias voltages to other field effect transistors. In this case, while no special limitation is placed on the bias voltage supplied to the field effect transistor at the final stage except that the voltage should be about 0.5 V lower than the maximum bias voltage supplied to other field effect transistors.

In this case, the semiconductor amplifier circuit has a configuration incorporating a plurality of field effect transistors in the form of a multiplicity of stages and including an input terminal, an output terminal, a plurality of reference potential terminals and control terminals connected to the gate terminals of the plurality of field effect transistors. The control terminals comprise first control terminals connected to the gates of field effect transistors other than the field effect transistor at the final stage and a second control terminal connected to the gates of the field effect transistor at the final stage.

In the configuration described in the above (1), (a) the gate voltage of each of the field effect transistors can be controlled by the output signal of the automatic power control circuit (APC circuit) based on a power level instruction signal such that a high level signal is input to a node B (bias switch terminal) of the correction circuit in a high power mode to use the gate voltage of each field effect transistor in a linear state and such that a low level signal is input to the bias switch terminal of the correction circuit in a low power mode to use the same in a high state of efficiency (amplifying efficiency) of the field effect transistor at the final stage. This makes it possible to the field effect transistor at the final stage with high improve linearity in the low power mode and AM/AM characteristics and to reduce power consumption thereby expanding the life of the battery. The improved battery life results in an improvement of call time. The reduction in power consumption leads to a reduction of the size of a battery, which makes it possible to reduce the size and weight of a radio communication apparatus.

(b) The field effect transistor at the final stage and the correction field effect transistor have a monolithic configuration, and the correction field effect transistor is in a size which is a reduction of the size of the field effect transistor at the final stage at a predetermined ratio. Therefore, the change in the gate bias voltage caused by the output signal (control signal) from the automatic power control circuit will occur with high accuracy which is in accordance with not only the peak power (maximum gate voltage) but also the slopes of the rise and fall of the transmission output and will be stable against variation in the characteristics of FETs and fluctuations of the same attributable to temperature.

In the aspect as described in the above (2), there is provided a configuration according to the aspect (1) in which the output signal of the automatic power control circuit is input to the node B such that the correction circuit is in a low power mode when the output signal of the automatic power control circuit is lower than a prescribed voltage and in a high power mode when it is higher than the voltage. Thus, the same effects as those in the first aspect can be achieved. Specifically, it is possible to improve linearity of the low power mode and AM/AM characteristics and to reduce power consumption thereby expanding the life of a battery.

According to the third aspect, no correction circuit is provided unlike the first aspect, and all field effect transistors are controlled by an automatic power control circuit in the high power mode and the gate bias of the final stage field effect transistor is kept constant in the low power mode and other field effect transistors are controlled by the automatic power control circuit. Therefore, high efficiency is achieved with improved AM/AM characteristics in the low power mode as in the first aspect, and the life of a battery, i.e., call time is expanded.

DETAILED DESCRIPTION OF THE PREFERRED EMBODIMENTS

Preferred embodiments of the present invention will now be described with the accompanying drawings. Throughout the drawings for explaining a mode for carrying out the invention, parts having like functions are indicated by like reference numbers and will not be described repeatedly.

While the following description will refer to field effect transistors (FETs) as an example of semiconductor amplification element, the semiconductor amplification elements are not limited to field effect transistors and may include bipolar transistors, heterojunction bipolar transistors (HBTs), high electron mobility transistors (HEMT) and the like. Semiconductor substrates on which the semiconductor amplification elements are to be formed are not limited to silicon substrates and may include silicon-germanium substrates, gallium-arsenide substrates and the like.

A first embodiment of the present invention will now be described.

As a first embodiment of the invention, a description will be made on a radio frequency power amplifier (radio frequency power module) having a multi-stage configuration comprised of field effect transistors cascaded in three stages and a portable telephone incorporating the radio frequency power module.

Figure 1:
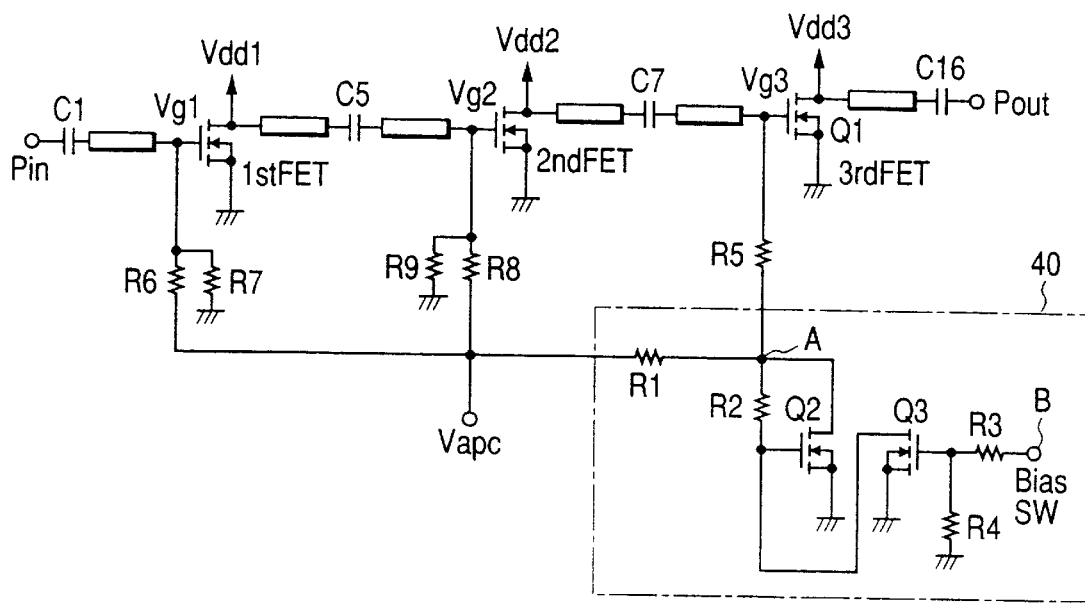
FIG. 1 is an equivalent circuit diagram of a radio frequency power module which is an embodiment (first embodiment) of the invention.
Figure 2:
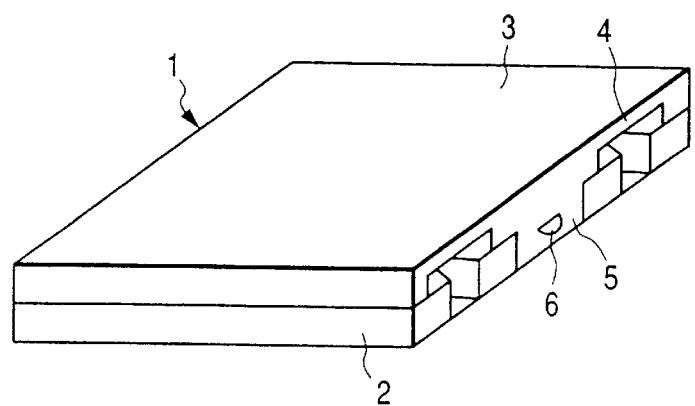
FIG. 2 is a perspective view showing the appearance of the radio frequency power module of the first embodiment.
Figure 3:
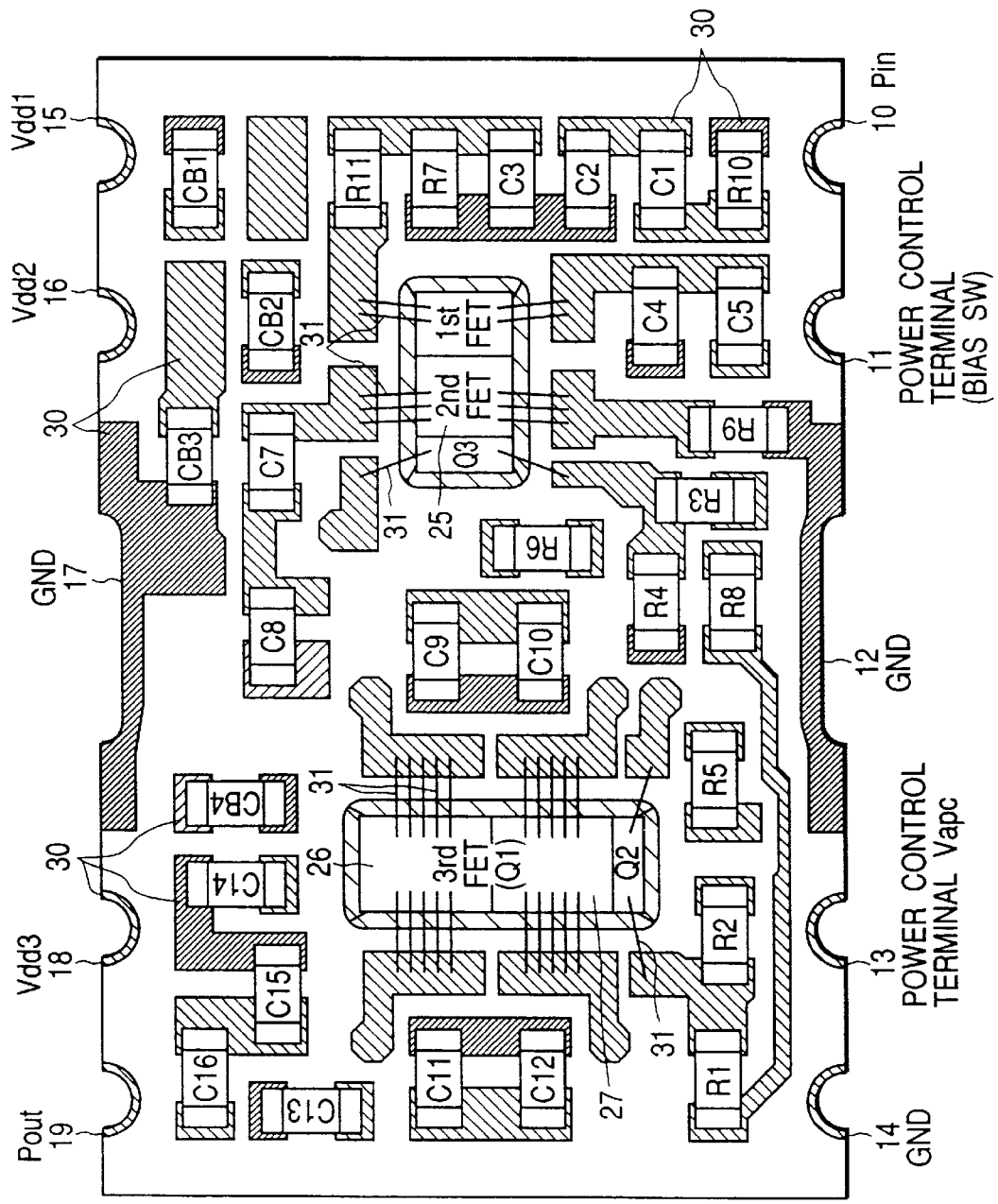
FIG. 3 is a plan view of a substrate of the radio frequency power module of the first embodiment.

FIGS. 1 through 6 are views of a radio frequency power amplifier (radio frequency power module) which is an embodiment (first embodiment) of the invention. FIG. 1 is an equivalent diagram of the radio frequency power module of the first embodiment. FIG. 2 is a perspective view showing the appearance of the radio frequency power module 1 of the first embodiment. FIG. 3 is a plan view of the substrate of the radio frequency power module.

As shown in FIG. 2, the radio frequency power amplifier (radio frequency power module) 1 of the present embodiment is externally viewed as a planar rectangular structure formed by placing a cap 3 over the upper surface (principle surface) of a sheet-like circuit board 2.

The radio frequency power module 1 has a structure which is a multi-stage circuit configuration formed by sequentially cascade-connecting a plurality of field effect transistors as active components. In the present embodiment, the field effect transistors (hereinafter also simply referred to as 37 transistors") are configured into three stages, i.e., a first stage transistor (first FET), a second stage transistor (second FET) and a final stage transistor (third FET) (see FIG. 3 and FIG. 1). The radio frequency power module 1 of the present embodiment serves as a radio frequency power module for a mobile telephone as a radio communication apparatus.

The cap 3 is a metal plate shaped in a rectangular box-like configuration which is secured to the circuit board 2 by engaging a hooking finger 6 protruding inwardly from a hook support arm 5 provided on a peripheral wall 4 thereof with a recessed anchoring portion (not shown) provided on a peripheral wall of the circuit board 2.

The cap 3 is electrically connected to a ground line on the circuit board 2 through the hooking finger 6 to form an electromagnetic shield element.

Electrode terminals (external terminals) are provided on the periphery of the lower surface of the circuit board 2, and the radio frequency power module 1 is secured to a mounting board such as a mother board on a surface mount basis.

FIG. 3 is a plan view of the circuit board 2. In FIG. 3, an input terminal Pin 10, a power control terminal Bias SW 11, a ground terminal GND 12, a power control terminal Vapc 13 and a ground terminal 14 are arranged in the order listed along one of the long sides (lower side in FIG. 3) of the circuit board 2 from the right to left. A power supply terminal Vdd1 15, a power supply terminal Vdd2 16, a ground terminal 17, a power supply terminal Vdd3 18 and an output terminal Pout 19 are arranged in the order listed along the other long side (upper side in FIG. 3) from the right to left.

Semiconductor chips 25 through 27 incorporating field effect transistors, a plurality of resistors indicated by an "R" symbol and a figure, a plurality of capacitors indicated by a "C" symbol and a figure and a plurality of bypass capacitors indicated by a "CB" symbol and a figure are secured to the surface of the circuit board 2.

Figure 4:
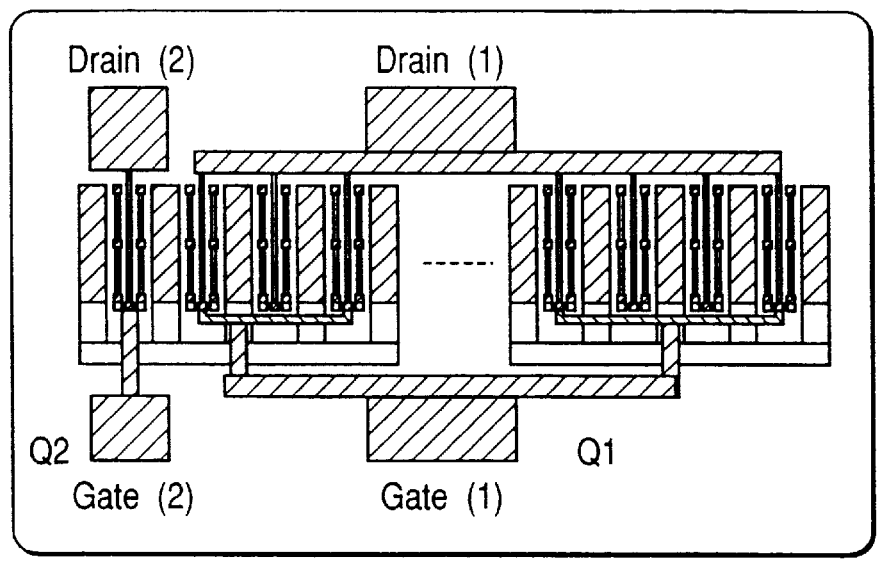
FIG. 4 is a plan view of a final stage transistor and a correction transistor for correcting a gate bias of the final stage transistor of the radio frequency power module of the first embodiment.

The first and second FETs are monolithically formed on a single semiconductor substrate. The third FET Q1 is formed by two semiconductor chips 26 and 27. A field effect transistor which is the third FET and a correction field effect transistor Q2 to be described later are monolithically formed on the semiconductor chip 27, i.e., the semiconductor substrate. A field effect transistor forming a part of Q1 and the filed effect transistor that constitutes Q2 have the same structure. As shown in FIG. 4, however, the size of Q2 is a reduction of the size of Q1 at a predetermined ratio which is about 1/500, although this is not limiting the invention. The purpose is to cause changes in a gate bias voltage caused by the output signal (control signal) of an automatic power control circuit to be described later to follow up precisely not only peak power (maximum gate voltage) but also the slopes of the rise and fall of transmission output. FIG. 4 shows patterns of the gates (Gate(1) and Gate(2)) of Q1 and Q2 and the drains (Drain(1) and Drain(2)) of Q1 and Q2.

The regions 30 with a mesh pattern in FIG. 3 are metalized layers which serve as pads for securing wiring and components, pads for wire connection and the like. Electrodes (not shown) of the semiconductor chips 25 through 27 and wiring regions which are regions 30 with a mesh pattern as described above are connected by conductive wires 31.

In practice, insulating resin is coated on regions where it is necessary such as the semiconductor chips 25 through 27 and wires 31.

An equivalent circuit of the radio frequency power module 1 of the present embodiment is as shown in FIG. 1. The equivalent circuit shows major parts only. The rectangles represent micro-strip lines.

In this circuit, the gate voltages Vg1, Vg2 and Vg3 of the first, second and third FETs are controlled through the power control terminal Vapc. In the present embodiment, a correction circuit 40 is provided between the power control terminal Vapc for inputting the output of the automatic power control circuit and the gate of the final stage field effect transistor (third FET).

As shown in FIG. 1, the correction circuit 40 has a configuration including an n-channel type correction field effect transistor Q2 whose drain is connected to a node A in a bias power supply application path between the gate of the final stage field effect transistor Q1 and the Vapc terminal, whose gate is connected to the same through a resistor R2 and whose source potential is fixed at a reference potential and including an n-channel type switching field effect transistor Q3 whose drain is connected to the gate of the correction field effect transistor Q2, whose source potential is fixed at a reference potential and whose gate potential is fixed at a reference potential through resistors R3 and R4, the resistors R3 and R4 being connected between the gate of the switching field effect transistor Q3 and a node B. The node B serves as the above-described bias switch terminal (Bias SW: power control terminal).

Input to the node B is a High level or Low level signal which is a signal output by an output power level control circuit to which a power level instruction signal received from a base station of a radio communication system is input.

Figure 5:
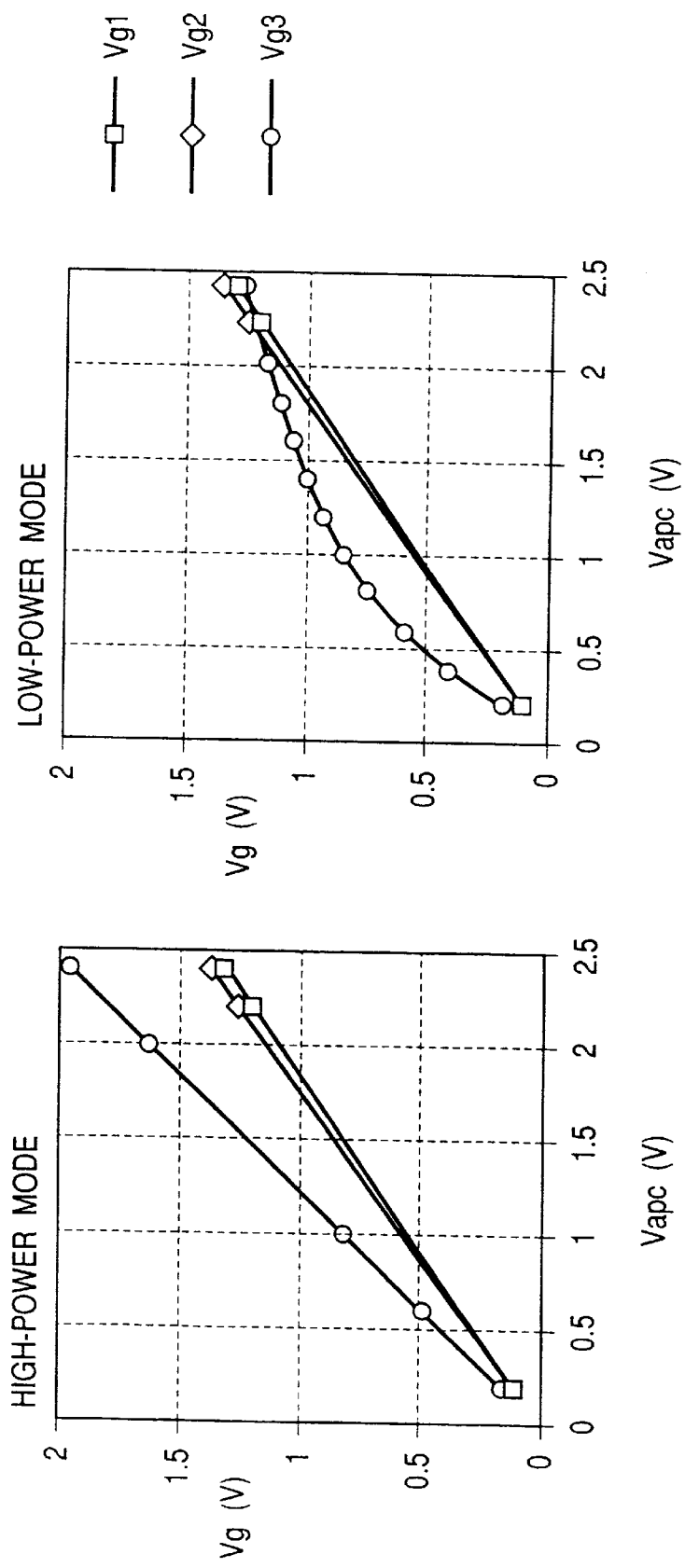
FIG. 5 is a graph showing correlation between a power control signal voltage and a gate bias voltage of each transistor of the radio frequency power module of the first embodiment in high and low power modes.

When the High level signal is input to the bias switch terminal, the switching field effect transistor Q3 is turned on; the gate of the correction field effect transistor Q2 is at the ground potential; and the gate voltage Vg of the correction field effect transistor Q2 exhibits characteristics which are proportionate to Vapc (see the graph on the left side of FIG. 5).

When the Low level signal is input to the bias switch terminal, the switching field effect transistor Q3 is turned off, and the correction field effect transistor Q2 forms a parallel forward clipper circuit which has characteristics as indicated by the graph on the right side of FIG. 5. Specifically, when the Low level signal is input, as indicated by the graph on the right side of the FIG. 5 (graph for a low power mode), the final stage field effect transistor is characterized in that its maximum gate voltage is equal to or lower than the gate voltages of the other field effect transistors (first and second FETs) and in that the rate of increase of the gate voltage relative to the output voltage of the automatic power control circuit gradually decreases.

In a mobile telephone incorporating the radio frequency power module 1 according to the present embodiment, the High level signal and Low level signal are generated based on a power level instruction signal transmitted by a base station. The telephone is used in a high power mode when the output voltage Vapc of the automatic power control circuit is equal to or higher than a prescribed voltage and in a low power mode when it is lower than the prescribed voltage. For example, when the prescribed voltage is 1.5 V in the graph of FIG. 5, each of the transistors has a gate voltage Vg for which Vapc in the graph for the high power mode on the left side of FIG. 5 is 1.5 V or more in the high power mode and has a gate voltage Vg for which Vapc in the graph for the low power mode on the right side of FIG. 5 is lower than 1.5 V in the low power mode.

Therefore, as apparent from the graph for the low power mode on the right side of FIG. 5, the correction circuit 40 improves the amplifying efficiency at a voltage below 1.5 V because the rate of change of the gate voltage Vg of the final stage field effect transistor (third FET) gradually becomes small relative to the rate of increase of Vapc at a voltage of 2 V or less.

Figure 6:
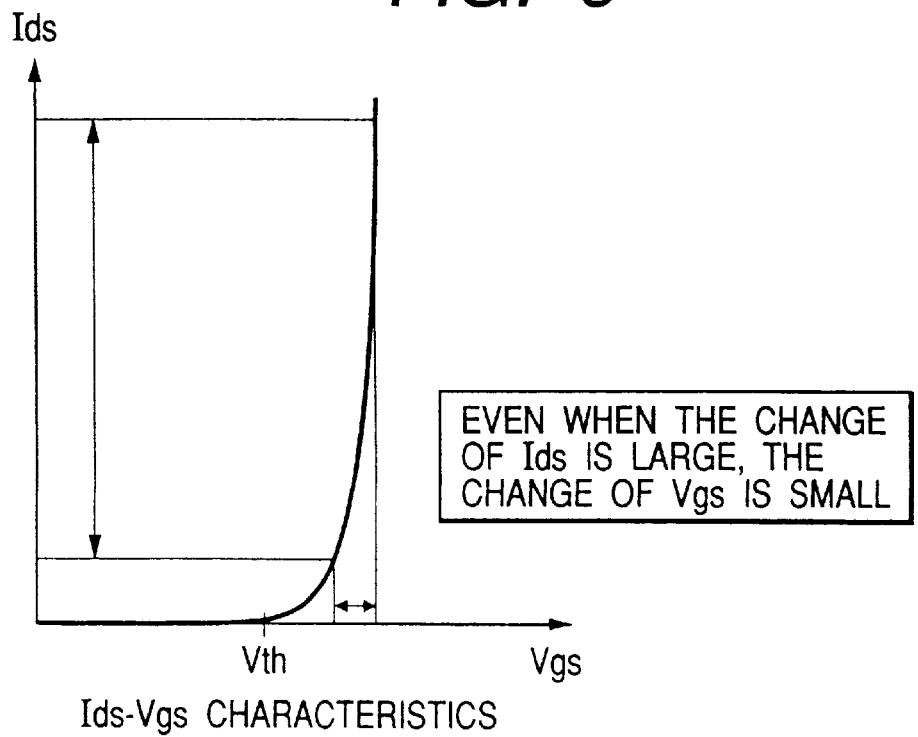
FIG. 6 is a graph showing correlation between the gate-source voltage and drain-source current of the correction transistor.

As indicated by the graph in FIG. 6, this is attributable to the fact that the change in the gate-source voltage Vgs of the correction transistor Q2 is small even when the dra4Ln-source current Ids changes significantly. That is, this is because the gate-source voltage Vgs can be clamped (clipped) utilizing the fact that no significant change occurs in the gate-source voltage Vgs even when the drain-source current Ids changes significantly in the region where the Ids-Vgs property of the transistor Q2 is equal to or greater than Vth.

Figure 7:
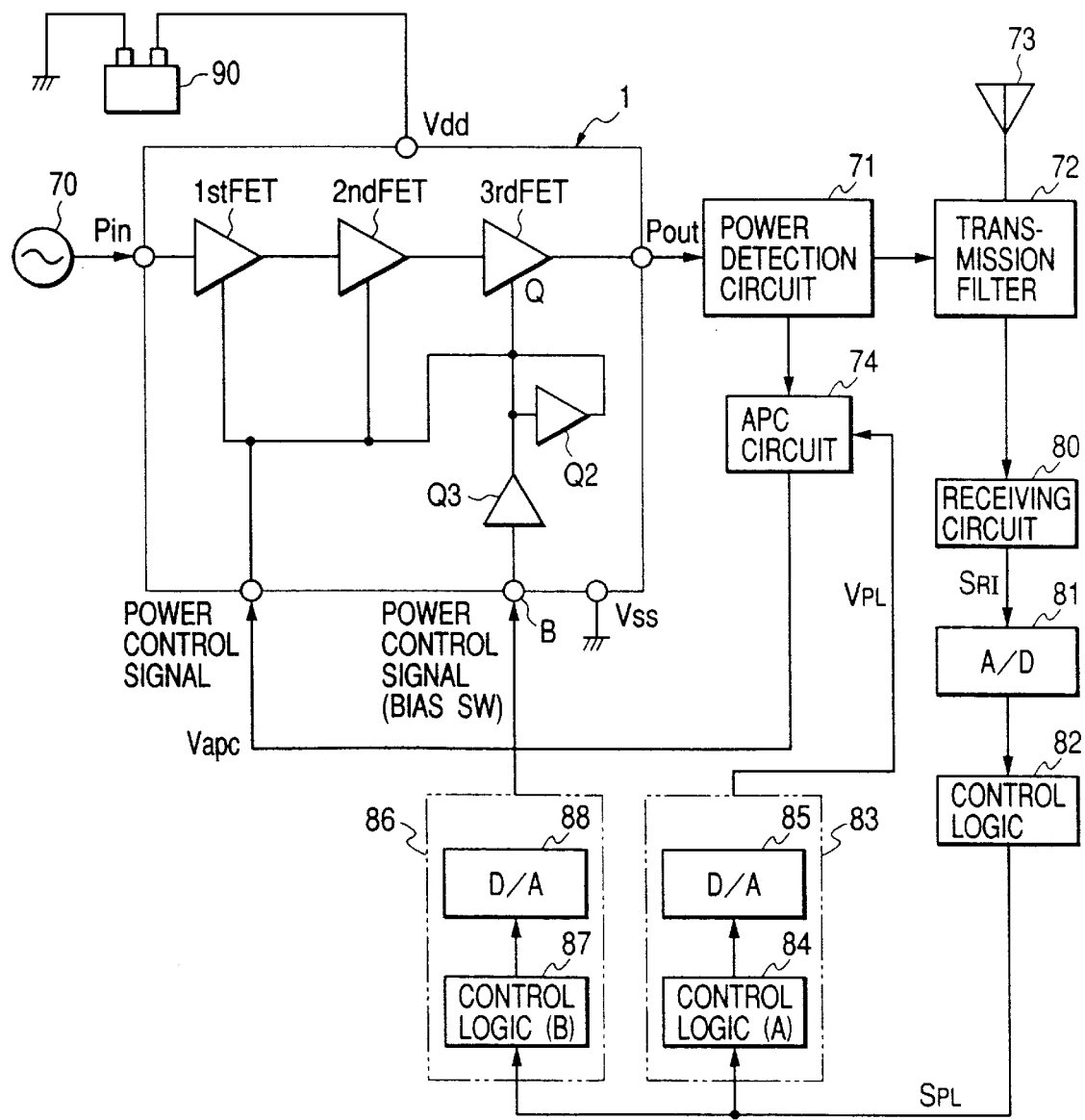
FIG. 7 is a circuit block diagram of a part of a mobile portable telephone incorporating the radio frequency power module of the first embodiment.

FIG. 7 is a circuit block diagram of a part of a mobile telephone (portable telephone) incorporating the radio frequency power module of the present embodiment.

In the portable telephone, as shown in the circuit block diagram in FIG. 7, an RF transmission signal oscillated by an oscillator 70 is input to the input terminal Pin of the radio frequency power module 1. The RF transmission signal amplified by the radio frequency power module 1 and output from the output terminal Pout is sent through a power detection circuit 71 and a transmission filter 72 to an antenna 73 to be transmitted as an electric wave.

An RF reception signal received by the antenna 73 is subjected to signal processing at a receiving circuit 80. A reception intensity signal $S_{RI}$ output by the receiving circuit 80 is converted into a digital signal by an A-D converter 81 and is output to a control logic 82.

The control logic 82 outputs a power level instruction signal $S_{PL}$ to a control logic A 84 of an output power level control circuit 83 and a control logic B 87 of an output power correction control circuit 86.

The control logic A 84 processes the power level instruction signal $S_{PL}$ transmitted thereto to output a new output signal. The signal is converted into an analog signal by a D-A converter 85 and is output to an automatic power control (APC) circuit 74 as a power level instruction voltage $V_{PL}$ which serves as a signal to control the APC circuit 74. The APC circuit 74 provides input to the power control terminal Vapc.

The control logic B 87 processes the power level instruction signal $S_{PL}$ transmitted thereto to output a new output signal. The signal is converted into an analog signal by an D-A converter 88 and is output to the power control terminal Bias SW as the high level signal or low level signal.

A battery 90 is connected to the power supply terminals Vdd (Vdd1 through Vdd3) of the radio frequency power module 1.

The present embodiment provides the following advantages.

(1) When the gate voltage of each field effect transistor is controlled by the signal output by the automatic power control circuit (APC circuit) based on the power level instruction signal, a High level signal is input to the node B (bias switch terminal) of the correction circuit 40 to allow the gate voltage of each field effect transistor to be used in a linear state in the high power mode, and a Low level signal is input to the bias switch terminal of the correction circuit 40 to allow the final stage field effect transistor (third FET) to be used with high efficiency (amplifying efficiency) in the low power mode. This makes it possible to improve linearity in the low power mode and AM/AM characteristics and to reduce power consumption thereby expanding the life of the battery. The improved battery life results in an improvement of call time. The reduction in power consumption leads to a reduction of the size of a battery, which makes it possible to reduce the size and weight of a radio communication apparatus.

(2) The final stage field effect transistor Q1 and the correction field effect transistor Q2 are monolithically formed, and the correction field effect transistor is in a size which is 1/M of the size of the final stage field effect transistor. Therefore, the change in the gate bias voltage caused by the output signal (control signal) from the automatic power control circuit will occur with high accuracy which is in accordance with not only the peak power (maximum gate voltage) but also the slopes of the rise and fall of the transmission output and will be stable against variation in the characteristics of FETs and fluctuations of the same attributable to temperature.

A second embodiment of the invention will now be described.

Figure 8:
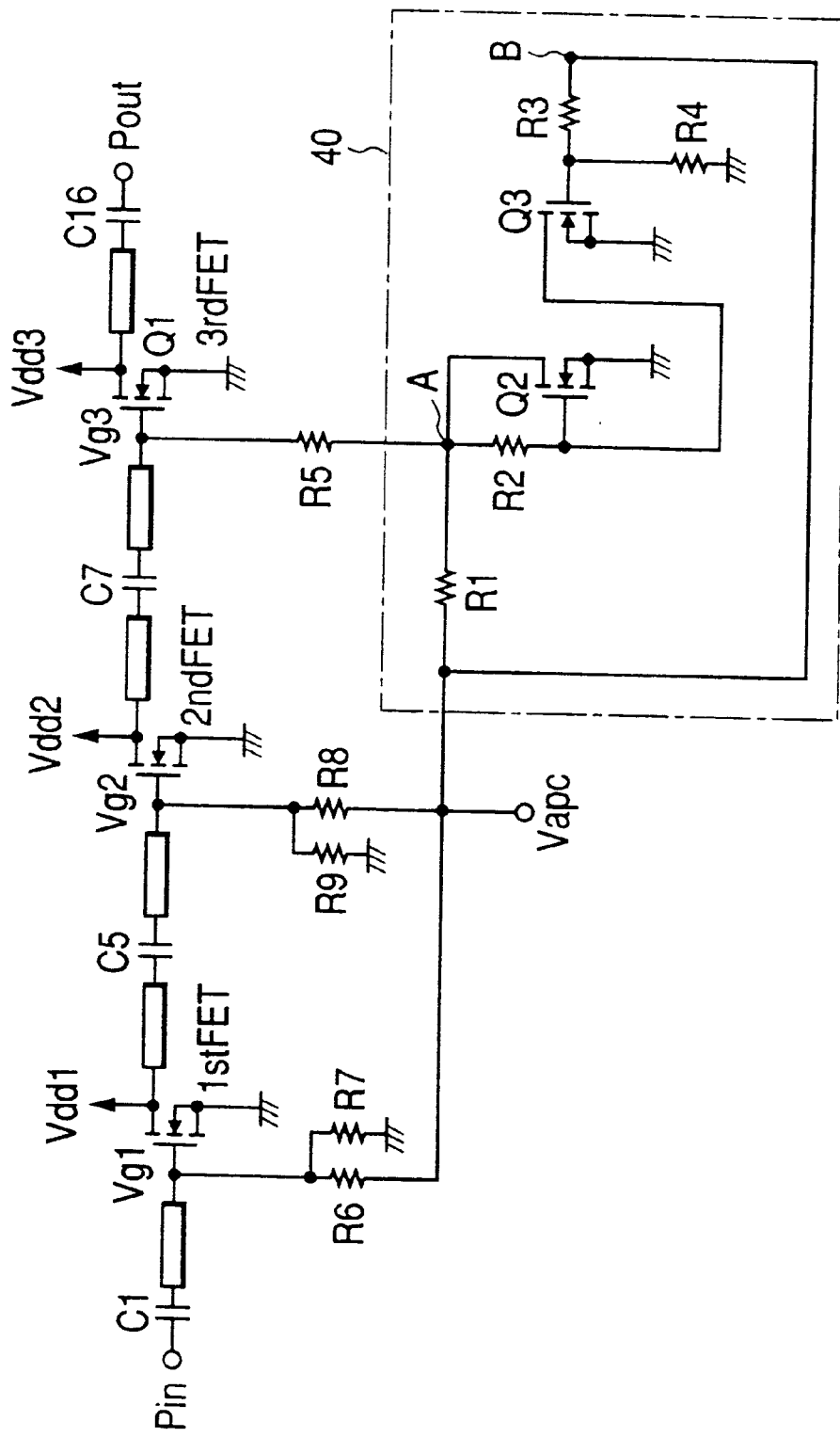
FIG. 8 is an equivalent circuit diagram of a radio frequency power module which is another embodiment (second embodiment) of the invention.
Figure 9:
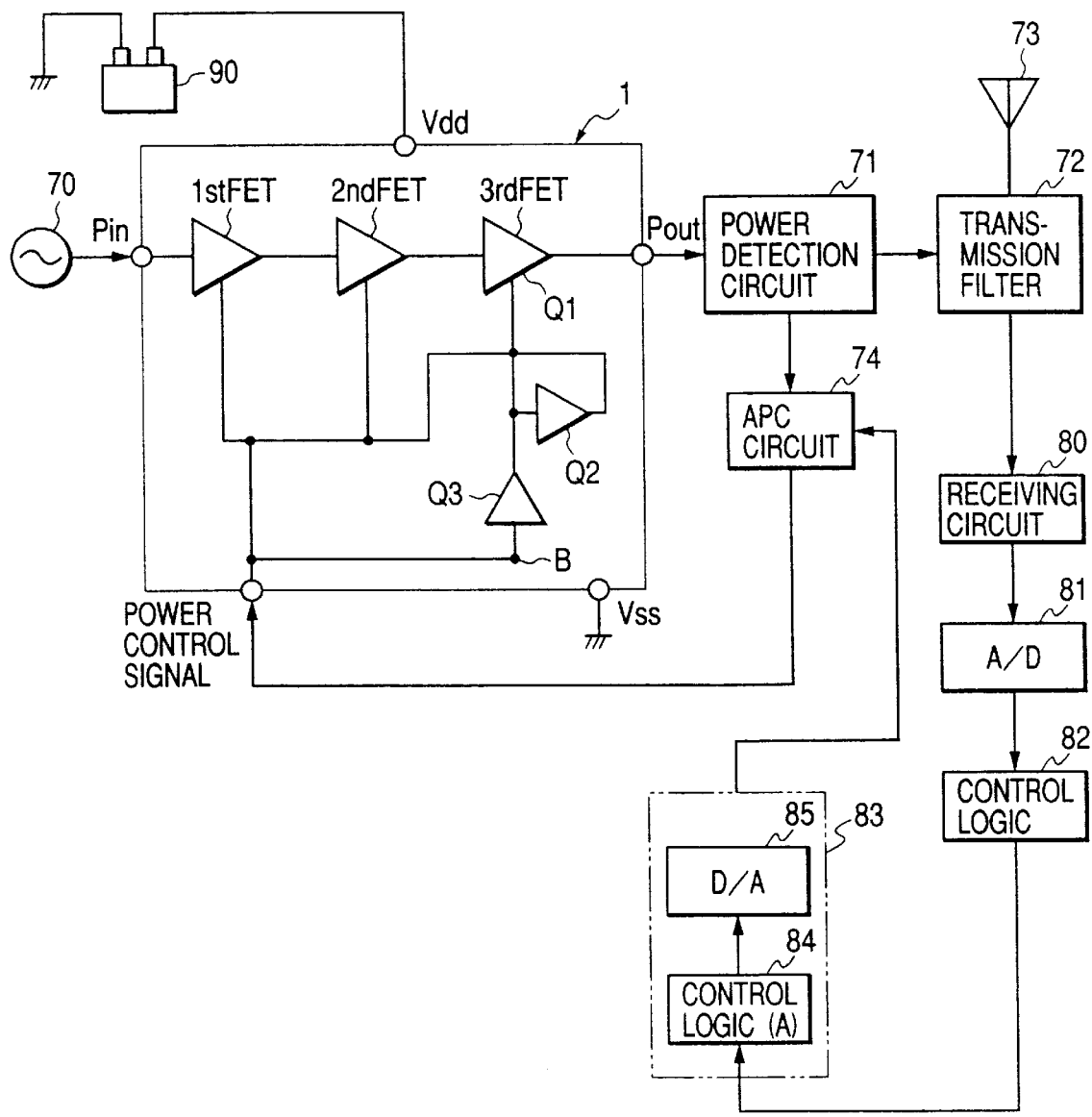
FIG. 9 is a circuit block diagram of a part of a mobile portable telephone incorporating the radio frequency power module of the second embodiment.
Figure 10:
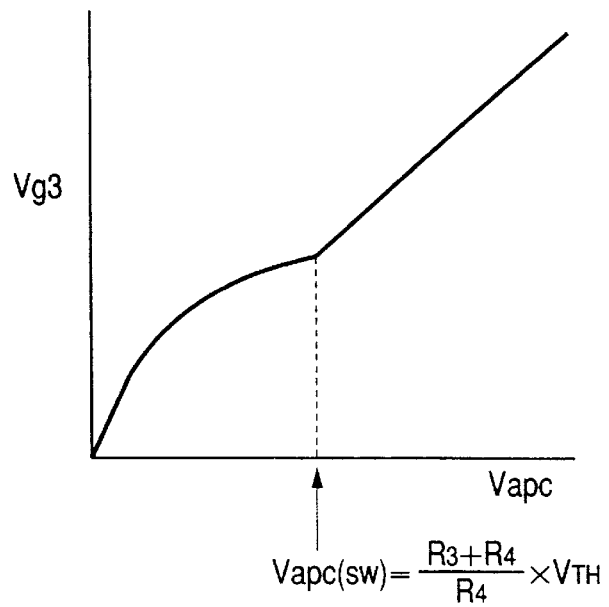
FIG. 10 is a graph showing correlation between a gate bias voltage of a final stage transistor and a power control signal voltage in the portable telephone incorporating the radio frequency power module of the second embodiment.

FIGS. 8 through 10 are views of a radio frequency power module which is another embodiment (second embodiment) of the invention and a portable telephone incorporating the same radio frequency power module.

The radio frequency power module of the second embodiment has a configuration as represented by the equivalent circuit shown in FIG. 8.

As shown in the equivalent circuit of FIG. 8, the radio frequency power module 1 of the present embodiment is a radio frequency power module according to the first embodiment in which the node B is connected to Vapc, i.e., the automatic power control circuit. This circuit enables a low power mode when the output signal of the automatic power control circuit is lower than a prescribed voltage and enables a high power mode when it is higher than the prescribed voltage.

FIG. 9 is a circuit block diagram showing a part of the portable telephone incorporating the radio frequency power module according to the present embodiment. This circuit block has a configuration according to the first embodiment except that the output power correction control circuit connected to the node B is eliminated from the control logic 82. The prescribed voltage Vapc (SW) which is the point for switching between the high power mode and low power mode at the APC circuit 74 is given by the following equation, although it is also illustrated in FIG. 10.

$$Vapc(SW) = (R3+R4)/R4 \times Vth$$

FIG. 10 is a graph showing correlation between the gate bias voltage Vg3 of the final stage transistor and the power control signal voltage Vapc in the portable telephone incorporating the radio frequency power module of the present embodiment.

In the present embodiment, the low power mode (characteristics shown on the right side of FIG. 5) is enabled when Vapc is smaller than the prescribed voltage Vapc (SW) and the high power mode (characteristics shown on the left side of FIG. 5) is enable when Vapc is greater, which makes it possible to improve amplifying efficiency in the low power mode. The present embodiment is similar to the first embodiment in that the improved of efficiency in the low power mode makes it possible to improve linearity in the low power mode and AM/AM characteristics and to reduce power consumption thereby expanding the life of the battery. The improved battery life results in an improvement of call time. The reduction in power consumption leads to a reduction of the size of a battery, which makes it possible to reduce the size and weight of a radio communication apparatus.

A third embodiment of the invention will now be described.

FIGS. 11 through 16 are views of a radio frequency power module which is another embodiment (third embodiment) of the invention and a portable telephone incorporating the same radio frequency power module.

Figure 11:
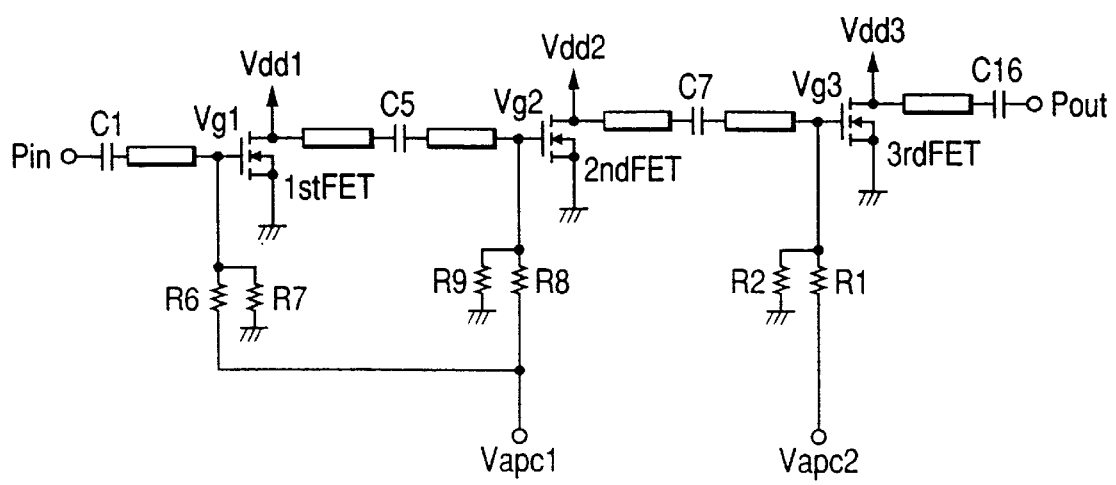
FIG. 11 is an equivalent circuit diagram of a radio frequency power module which is another embodiment (third embodiment) of the invention.

The radio frequency power module of the third embodiment has a configuration as represented by the equivalent circuit shown in FIG. 11.

As shown in the equivalent circuit of FIG. 11, the radio frequency power module 1 of the present embodiment has a configuration in which no correction circuit is provided unlike the first embodiment and in which the control terminals are constituted by a first control terminal Vapc1 connected to the gates of field effect transistors (first and second FETs) excluding the field effect transistor at the final stage (third FET) and a second control terminal Vapc2 connected only to the gate of the final stage field effect transistor (third FET).

Figure 16:
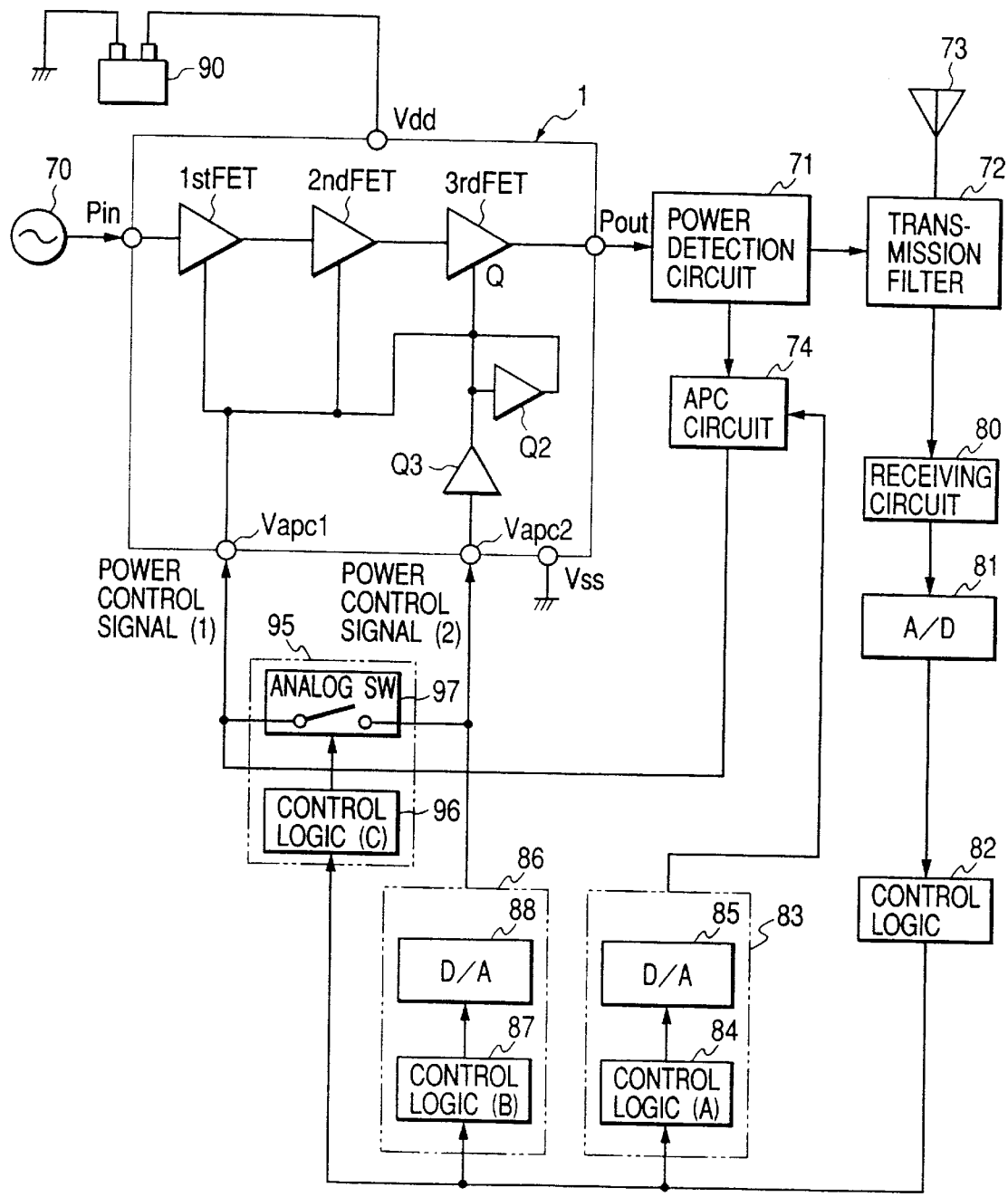
FIG. 16 is a circuit block diagram of a part of a mobile portable telephone incorporating the radio frequency power module of the third embodiment.

FIG. 16 is a circuit block diagram showing a part of the portable telephone incorporating the radio frequency power module of the present embodiment. This circuit is similar to the circuit of the first embodiment except that it comprises an initial stage control circuit system for inputting the output signal of the output power level control circuit 83 to the APC circuit 74 and for inputting the output signal of the APC circuit 74 to the first control terminal Vapc1 to control the first and second FETs and a final stage control circuit system for inputting the output signal of the output power correction control circuit 86 to the second control terminal Vapc2 to control the final stage field effect transistor (third FET) at a constant voltage.

The initial stage control circuit system and the final stage control circuit system are switched by a mode switching circuit 95. In the high power mode, all of the transistors (first, second and third FETs) in the multi-stage configuration are controlled by the APC circuit 74. In the low power mode, the first and second FETs are controlled by the APC circuit 74, and the third FET is controlled by the final stage control circuit system at a constant voltage.

The mode switching circuit 95 comprises a control logic C 96 and an analog switch SW 97 controlled by the control logic C 96. The mode switching circuit 95 is switched by a signal output by the control logic 82.

Figure 12:
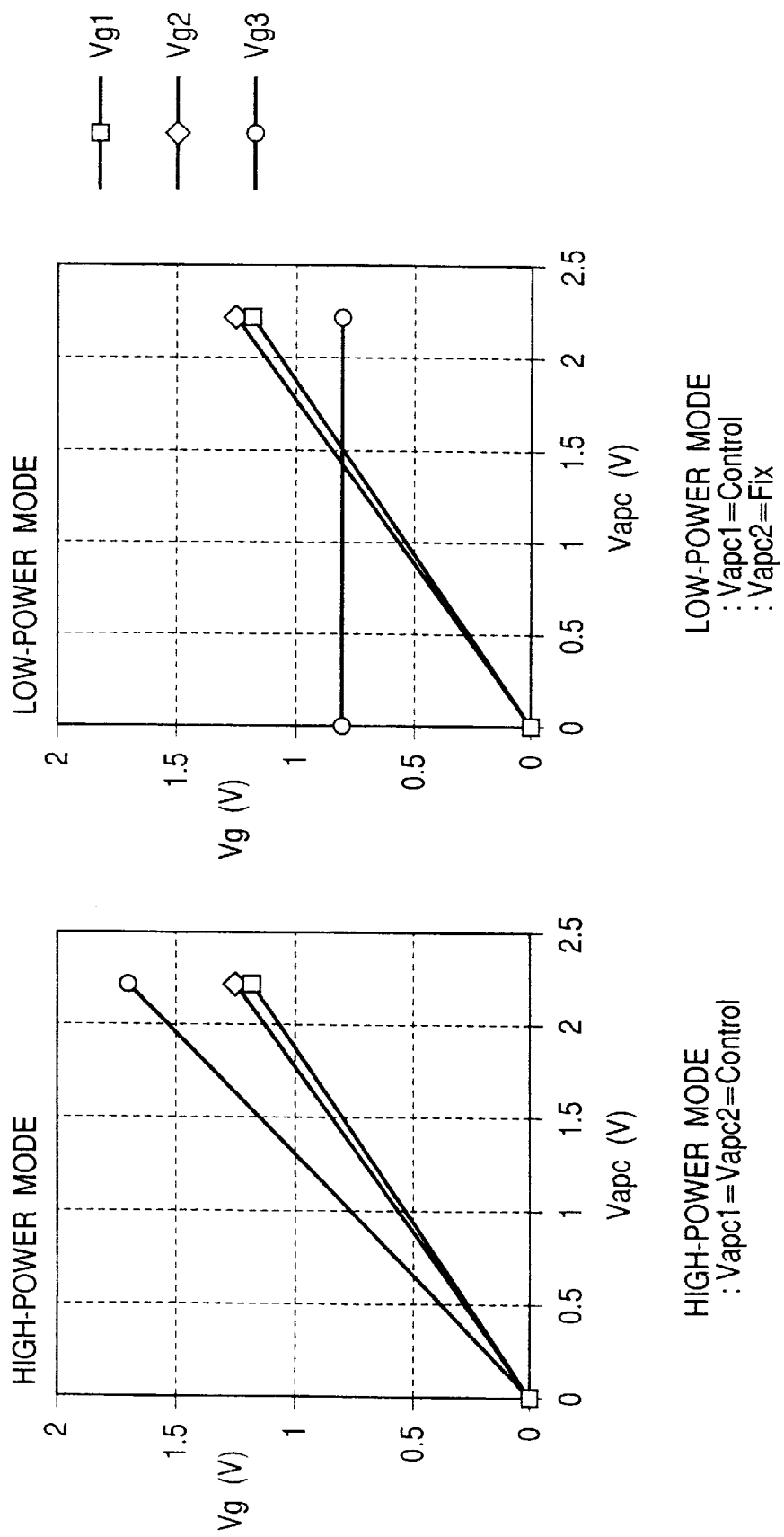
FIG. 12 is a graph showing correlation between a power control signal voltage and a gate bias voltage of each transistor of the radio frequency power module of the third embodiment in high and low power modes.
Figure 13:
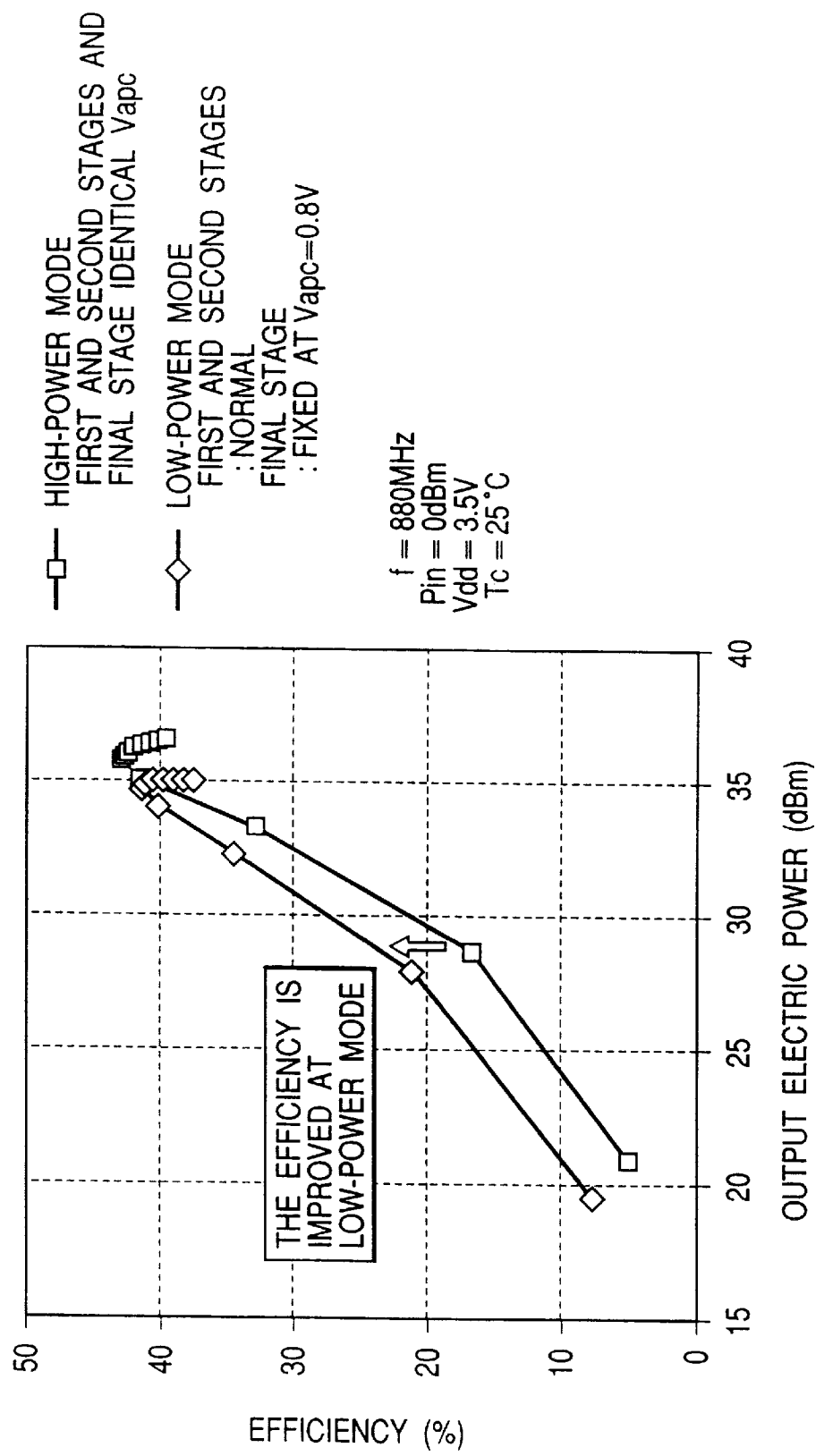
FIG. 13 is a graph showing correlation between output power and efficiency of the radio frequency power module of the third embodiment in the high and low power modes.
Figure 15:
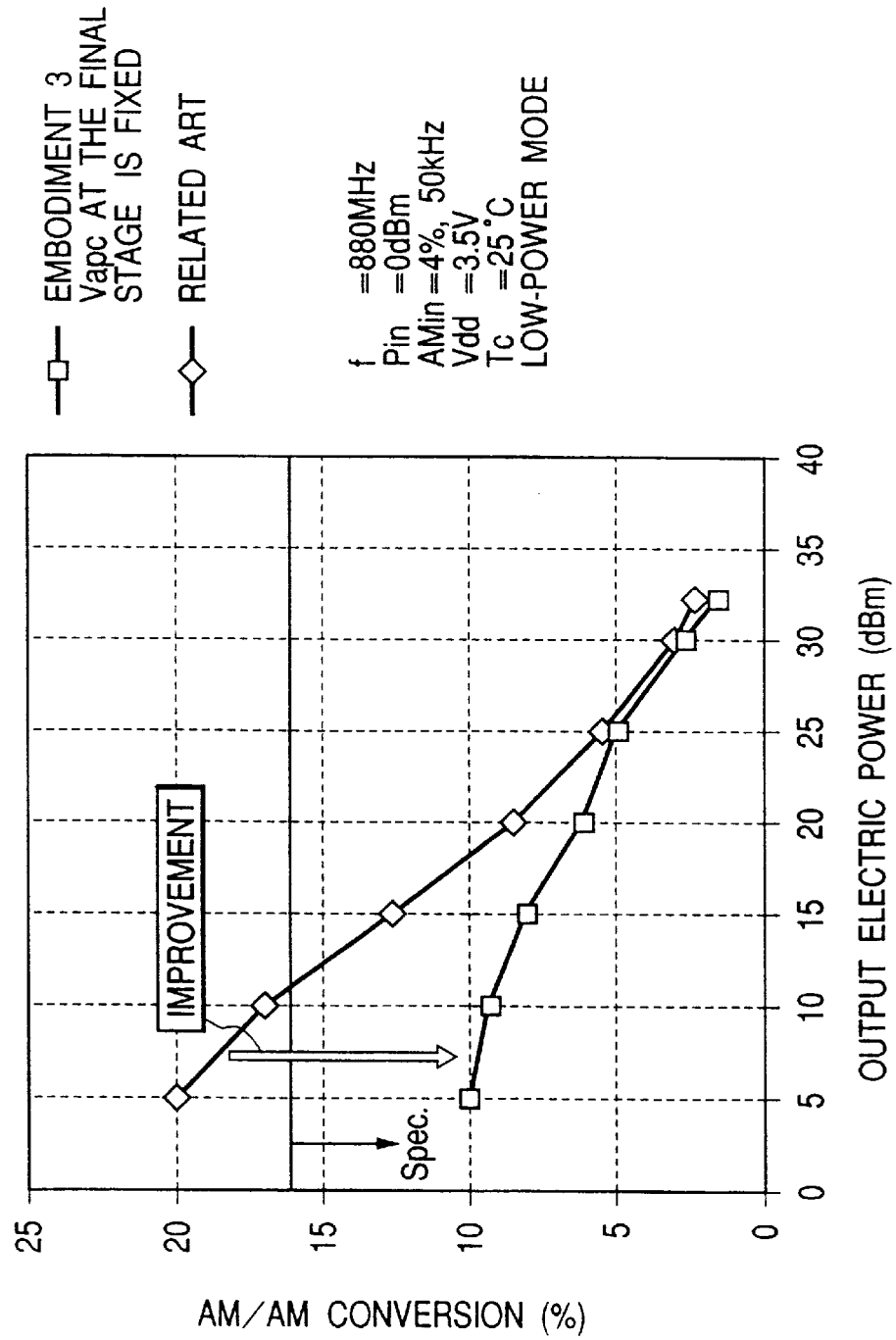
FIG. 15 is a graph showing correlation between output power and AM/AM characteristics of the radio frequency power module of the third embodiment and a conventional radio frequency power module.

FIG. 12 is a graph showing correlation between the power control signal voltage and the gate bias voltage of each transistor in the high and low power modes. In the low power mode, the third FET has a constant gate voltage Vg. For example, an operation in the high power mode is enabled when Vapc is higher than, for example, 1.4 V, and an operation in the low power mode is enable when Vapc is lower than the same. Amplifying efficiency is improved as shown in the graph of FIG. 13, and AM/AM characteristics are improved as shown in the graph of FIG. 15.

Figure 14:
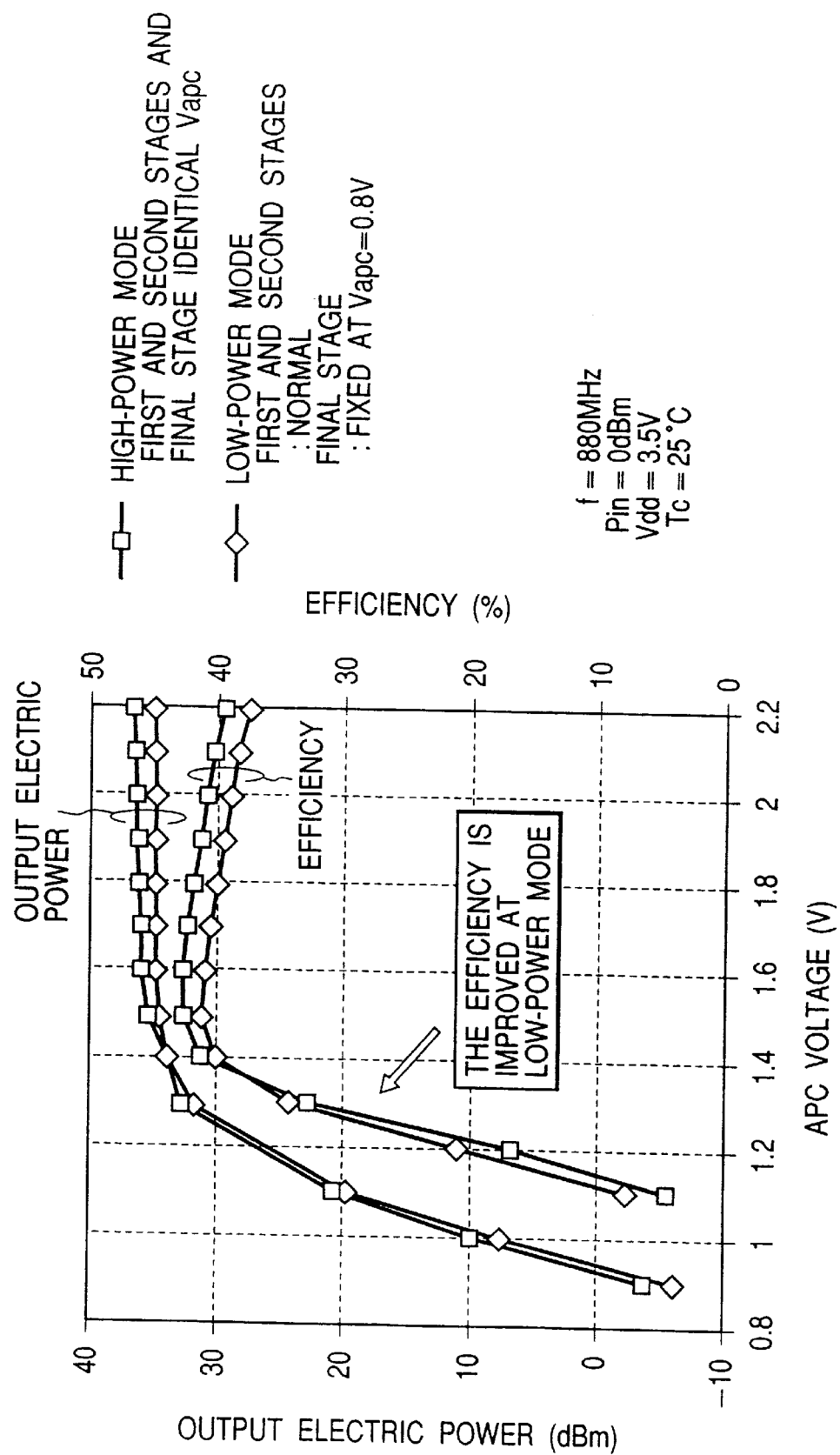
FIG. 14 is a graph showing correlation between a power control signal voltage and the output power of the radio frequency power module of the third embodiment in the high and low power modes.

FIG. 14 is a graph showing correlation between the power control signal voltage and the output power of the radio frequency power module of the present embodiment in the high and low power modes. The use of the low power mode with Vapc smaller than 1.4 V improves the efficiency of the output power by about 6% when the output power is 30 dBm (the efficiency in the high power mode is about 23% and the efficiency in the low power mode is about 29%).

The present embodiment is similar to the first embodiment in that the improved efficiency in the low power mode makes it possible to improve linearity in the low power mode and AM/AM characteristics and to reduce power consumption thereby expanding the life of the battery. The improved battery life results in an improvement of call time. The reduction in power consumption leads to a reduction of the size of a battery, which makes it possible to reduce the size and weight of a radio communication apparatus.

While the invention has been specifically described based on preferred embodiments of the same, the invention is not limited to those embodiments and may obviously modified in various ways within the range of the principle of the same.

While the invention has been described above with reference to portable telephones which is the field of the application of the same, the invention is not limited thereto and may be applied to other mobile communication apparatuses such as mobile phones.

The invention may be applied to at least radio communication technique driven by a battery.

Advantages provided typical aspects of the present invention can be briefly described as follows.

(1) A High level signal and a Low level signal are switched based on a power level instruction signal to enable a high power mode or a low power mode. In the low power mode, since a final stage field effect transistor has a relatively high bias, it is possible to improve linearity and AM/AM characteristics in the low power mode and to reduce power consumption.

(2) The life of battery is expanded accordingly.

(3) It is also possible to improve call time because of the reduction in power consumption.

(4) The reduction in power consumption results in a reduction of the size of a battery, allowing the size and weight of a radio communication apparatus to be reduced.

What is claimed is:

1. A radio communication apparatus comprising:

a first semiconductor chip including a first amplifying element having an input terminal and an output terminal, and a bias circuit which provides the input terminal of the first amplifying element with a bias voltage in accordance with a power control voltage;

a second semiconductor chip including a second amplifying element having an input terminal to which a signal provided from the output terminal of the first amplifying element is supplied and an output terminal which provides an output signal to be supplied to an antenna; and a control circuit coupled to the bias circuit and to the input terminal of the second amplifying element and controlling a bias voltage to the input terminal of the second amplifying element, wherein the control circuit has a first mode and a second mode, and a changing rate in the bias voltage to be supplied to the input terminal of the second amplifying element for change in the power control voltage is different between the first mode and the second mode.

2. A radio communication apparatus according to claim 1, wherein the control circuit includes a third amplifying element having an input terminal and an output terminal which is coupled to the input terminal of the second amplifying element and to the bias circuit, and a resistance element coupled between the input terminal of the third amplifying element and the output terminal of the third amplifying element.

3. A radio communication apparatus according to claim 2, wherein the first semiconductor chip includes a fourth amplifying element having an input terminal to which a bias voltage from the bias circuit is supplied and an output terminal which provides an output signal to the input terminal of the first amplifying element.

4. A radio communication apparatus according to claim 3, wherein the control circuit is included in the second semiconductor chip.

5. A radio communication apparatus according to claim 4, wherein the first amplifying element, the second amplifying element, the third amplifying element and the fourth amplifying element are MOSFETs.

6. A radio communication apparatus according to claim 5, wherein the control circuit receives a control signal for indicating a mode of the control circuit.

7. A radio communication apparatus according to claim 6, wherein a voltage at the input terminal of the third amplifying element is changed in accordance with the control signal.

8. A radio communication apparatus according to claim 2, wherein the control circuit is included in the second semiconductor chip.

9. A radio communication apparatus according to claim 8, wherein the first amplifying element, the second amplifying element, the third amplifying element and the fourth amplifying element are MOSFETs.

10. A radio communication apparatus according to claim 9, wherein the control circuit receives a control signal for indicating a mode of the control circuit.

11. A radio communication apparatus according to claim 10, wherein a voltage at the input terminal of the third amplifying elemene is changed in accordance with the control signal.

* * * * *